(12) United States Patent
Sung et al.

(10) Patent No.: US 10,593,838 B2
(45) Date of Patent: Mar. 17, 2020

(54) SEMICONDUCTOR DEVICE

(71) Applicant: LG INNOTEK CO., LTD., Seoul (KR)

(72) Inventors: Youn Joon Sung, Seoul (KR); Jin Soo Park, Seoul (KR); Rak Jun Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/100,785

(22) Filed: Aug. 10, 2018

(65) Prior Publication Data
US 2019/0051797 A1 Feb. 14, 2019

(30) Foreign Application Priority Data

Aug. 14, 2017 (KR) .................. 10-2017-0103159

(51) Int. Cl.
*H01L 33/38* (2010.01)
*H01L 33/12* (2010.01)
(Continued)

(52) U.S. Cl.
CPC .............. *H01L 33/38* (2013.01); *H01L 33/12* (2013.01); *H01L 33/325* (2013.01); *H01L 31/03046* (2013.01); *H01L 33/44* (2013.01)

(58) Field of Classification Search
CPC ....... H01L 33/38; H01L 33/12; H01L 33/325; H01L 33/44
See application file for complete search history.

(56) References Cited

U.S. PATENT DOCUMENTS 5,153,889 A 10/1992 Sugawara et al.
6,614,119 B1 9/2003 Asahina et al.
(Continued)

FOREIGN PATENT DOCUMENTS

EP 1 385 215 A2 1/2004
EP 1 453 160 9/2004
(Continued)

OTHER PUBLICATIONS

United States Notice of Allowance dated Feb. 15, 2019 issued in co-pending related U.S. Appl. No. 15/692,617.
(Continued)

*Primary Examiner* — Ida M Soward
(74) *Attorney, Agent, or Firm* — KED & Associates, LLP

(57) ABSTRACT

The embodiment discloses a semiconductor device which includes: a light emitting structure including a first conductive semiconductor layer, a second conductive semiconductor layer, and an active layer; a first electrode electrically connected to the first conductive semiconductor layer; a second electrode electrically connected to the second conductive semiconductor layer; a first cover electrode disposed on the first electrode; and an insulation layer disposed between the first electrode and the second electrode, wherein the insulation layer comprises a first insulation portion disposed between the first conductive semiconductor layer and the first cover electrode, and a second insulation portion disposed on the first cover electrode, wherein the first cover electrode comprises a first protrusion portion disposed between an upper surface of the first insulation portion and a lower surface of the second insulation portion.

19 Claims, 11 Drawing Sheets

(51) Int. Cl.
*H01L 33/32* (2010.01)
*H01L 33/44* (2010.01)
*H01L 31/0304* (2006.01)

(56) References Cited

U.S. PATENT DOCUMENTS

| | | | |
|---|---|---|---|
| 6,777,253 B2 | 8/2004 | Ishibashi et al. | |
| 8,154,042 B2 | 4/2012 | Aldaz et al. | |
| 8,476,666 B2 | 7/2013 | Kim et al. | |
| 8,488,644 B2* | 7/2013 | Imai | H01S 5/18341 |
| | | | 372/46.01 |
| 8,592,954 B2* | 11/2013 | Emura | H01L 33/44 |
| | | | 257/632 |
| 8,969,898 B2* | 3/2015 | Onishi | H01L 33/44 |
| | | | 257/98 |
| 8,994,001 B2 | 3/2015 | Son | |
| 9,276,167 B2 | 3/2016 | Höppel | |
| 9,401,452 B2 | 7/2016 | Northrup et al. | |
| 9,450,151 B2* | 9/2016 | Choi | H01L 33/382 |
| 9,537,055 B2* | 1/2017 | Park | H01L 33/62 |
| 9,540,252 B1 | 1/2017 | Collins et al. | |
| 9,711,682 B2 | 7/2017 | Han et al. | |
| 9,748,410 B2 | 8/2017 | Kinoshita et al. | |
| 10,347,804 B2* | 7/2019 | Yoo | H01L 25/0753 |
| 2002/0088985 A1* | 7/2002 | Komoto | H01L 33/507 |
| | | | 257/99 |
| 2003/0006418 A1 | 1/2003 | Emerson et al. | |
| 2003/0141506 A1 | 7/2003 | Sano et al. | |
| 2005/0127391 A1 | 6/2005 | Yanamoto | |
| 2005/0179045 A1 | 8/2005 | Ryu et al. | |
| 2006/0131558 A1 | 6/2006 | Sato et al. | |
| 2006/0260671 A1 | 11/2006 | Ohta et al. | |
| 2007/0205375 A1 | 9/2007 | Ward et al. | |
| 2008/0061308 A1* | 3/2008 | Yoon | H01L 33/22 |
| | | | 257/94 |
| 2008/0185606 A1 | 8/2008 | Sano et al. | |
| 2008/0247435 A1 | 10/2008 | Choi | |
| 2010/0006884 A1* | 1/2010 | Ou | H01L 33/40 |
| | | | 257/98 |
| 2010/0096652 A1 | 4/2010 | Choi et al. | |
| 2011/0266568 A1 | 11/2011 | Aldaz et al. | |
| 2012/0040480 A1* | 2/2012 | Shieh | H01L 33/38 |
| | | | 438/26 |
| 2012/0085986 A1 | 4/2012 | Iwanaga et al. | |
| 2012/0292631 A1 | 11/2012 | Katsuno et al. | |
| 2013/0082237 A1 | 4/2013 | Northrup et al. | |
| 2013/0214320 A1 | 8/2013 | Onishi et al. | |
| 2014/0034981 A1* | 2/2014 | Hung | H01L 33/46 |
| | | | 257/98 |
| 2014/0084274 A1 | 3/2014 | Yamazaki et al. | |
| 2014/0183446 A1 | 7/2014 | Nago et al. | |
| 2014/0209955 A1 | 7/2014 | Kim et al. | |
| 2014/0219304 A1 | 8/2014 | Lee et al. | |
| 2014/0225143 A1* | 8/2014 | Kususe | H01L 33/62 |
| | | | 257/98 |
| 2014/0239341 A1 | 8/2014 | Matsumura | |
| 2015/0263305 A1 | 9/2015 | Premutico et al. | |
| 2015/0318435 A1 | 11/2015 | Nago et al. | |
| 2015/0380621 A1 | 12/2015 | Chae et al. | |
| 2016/0005919 A1 | 1/2016 | Obata | |
| 2016/0056338 A1 | 2/2016 | Park et al. | |
| 2016/0111600 A1 | 4/2016 | Chae et al. | |
| 2016/0149078 A1 | 5/2016 | Takeuchi et al. | |
| 2016/0218262 A1 | 7/2016 | Aketa et al. | |
| 2016/0247971 A1 | 8/2016 | Lee et al. | |
| 2016/0284941 A1 | 9/2016 | Seo et al. | |
| 2016/0365486 A1 | 12/2016 | Kim et al. | |
| 2017/0025566 A1 | 1/2017 | Song et al. | |
| 2017/0098736 A1 | 4/2017 | Lee et al. | |
| 2017/0170360 A1 | 6/2017 | Bour et al. | |
| 2017/0317236 A1 | 11/2017 | Lee et al. | |
| 2018/0069150 A1 | 3/2018 | Oh et al. | |
| 2018/0076355 A1* | 3/2018 | Hayashi | H01L 33/32 |
| 2018/0145219 A1 | 5/2018 | Kim et al. | |
| 2018/0151778 A1 | 5/2018 | Park et al. | |
| 2019/0326473 A1 | 10/2019 | Choi et al. | |

FOREIGN PATENT DOCUMENTS

| | | |
|---|---|---|
| EP | 2 955 763 | 12/2015 |
| EP | 2 988 339 | 2/2016 |
| EP | 3 043 395 | 7/2016 |
| EP | 3 073 539 | 9/2016 |
| EP | 3 291 314 | 3/2018 |
| JP | H 07-106631 | 4/1995 |
| JP | 2001-203385 | 7/2001 |
| JP | 2003-115642 | 4/2003 |
| JP | 2004-104157 | 4/2004 |
| JP | 2007-103690 | 4/2007 |
| JP | 2008-285758 | 11/2008 |
| JP | 2010-171272 | 8/2010 |
| JP | 2011-187591 | 9/2011 |
| JP | 2012-049337 | 3/2012 |
| JP | 2012-216603 | 11/2012 |
| JP | 2013-105917 | 5/2013 |
| JP | 2013-149889 | 8/2013 |
| JP | 2013-171982 | 9/2013 |
| JP | 2013-243254 | 12/2013 |
| JP | 5474292 | 4/2014 |
| JP | 2014-195055 | 10/2014 |
| JP | 2014-241397 | 12/2014 |
| JP | 2015-177023 | 10/2015 |
| JP | 2015-216352 | 12/2015 |
| JP | 2016-044095 | 4/2016 |
| JP | 2016-066691 | 4/2016 |
| JP | 2016-084822 | 5/2016 |
| JP | 2016-213448 | 12/2016 |
| KR | 10-2010-0044726 | 4/2010 |
| KR | 10-2014-0003351 | 1/2014 |
| KR | 10-2014-0006429 | 1/2014 |
| KR | 10-2014-0099379 | 8/2014 |
| KR | 10-1458389 | 11/2014 |
| KR | 10-2016-0037060 | 4/2016 |
| KR | 10-2016-0056524 | 5/2016 |
| KR | 10-2016-0062659 | 6/2016 |
| KR | 10-2016-0102774 | 8/2016 |
| KR | 10-2016-0103686 | 9/2016 |
| KR | 10-2016-0105126 | 9/2016 |
| KR | 10-2016-0117010 | 10/2016 |
| WO | WO 2005/101532 | 10/2005 |
| WO | WO 2010/146808 | 12/2010 |
| WO | WO 2014/123092 | 8/2014 |
| WO | WO 2015/156588 | 10/2015 |
| WO | WO 2016/004374 A1 | 1/2016 |
| WO | WO 2016/159638 | 10/2016 |
| WO | WO 2016/163083 | 10/2016 |
| WO | WO 2017/049053 | 3/2017 |

OTHER PUBLICATIONS

United States Office Action dated Feb. 21, 2019 issued in co-pending related U.S. Appl. No. 15/821,519.

Japanese Office Action dated Mar. 27, 2019 issued in Application No. 2017-168498.

European Search Report dated Dec. 13, 2018 issued in Application No. 18188482.6.

International Search Report (with English Translation) and Written Opinion dated Dec. 19, 2017 issued in Application No. PCT/KR2017/010065.

International Search Report (with English Translation) and Written Opinion dated Sep. 20, 2017 issued in Application No. PCT/KR2017/006473.

International Search Report (with English Translation) and Written Opinion dated Dec. 15, 2017 issued in Application No. PCT/KR2017/009954.

European Search Report dated Dec. 21, 2017 issued in EP Application No. 17 18 8926.

European Search Report dated Mar. 28, 2018 issued in EP Application No. 17203483.7.

(56) References Cited

OTHER PUBLICATIONS

U.S. *Ex parte Quayle* Office Action dated Apr. 26, 2018 issued in U.S. Appl. No. 15/692,617.
U.S. Office Action dated Aug. 31, 2018 issued in U.S. Appl. No. 15/692,617.
European Search Report dated May 14, 2019 issued in Application No. 17815692.3.
U.S. Office Action dated Aug. 22, 2019 issued in U.S. Appl. No. 15/821,519.
U.S. Appl. No. 15/692,617, filed Aug. 31, 2017.
U.S. Appl. No. 16/310,340, filed Dec. 14, 2018.
U.S. Appl. No. 16/331,015, filed Mar. 6, 2019.
U.S. Appl. No. 15/821,519, filed Nov. 22, 2017.
U.S. Appl. No. 16/331,039, filed Mar. 6, 2019.
U.S. Appl. No. 16/100,785, filed Aug. 10, 2018.
U.S. Appl. No. 16/415,245, filed May 17, 2019.
Japanese Office Action dated Sep. 3, 2019 issued in JP Application No. 2017-168498.
Japanese Office Action dated Oct. 8, 2019 issued in Application No. 2018-152495.
European Search Report dated Jul. 24, 2019 issued in EP Application No. 17851126.7.
European Search Report dated Jul. 11, 2019 issued in EP Application No. 17849159.3.
United States Office Action dated Dec. 19, 2019 issued in co-pending related U.S. Appl. No. 16/310,340.

* cited by examiner

SEMICONDUCTOR DEVICE

CROSS-REFERENCE TO RELATED APPLICATION

This application claims priority under 35 U.S.C. § 119 to Korean Application No. 10-2017-0103159 filed on Aug. 14, 2017, whose entire disclosure is/are hereby incorporated by reference.

BACKGROUND

1. Field

The present invention relates to a semiconductor device.

2. Background

Since semiconductor devices including a compound such as GaN and AlGaN have many advantages of energy with a wide and easily adjustable band gap and the like, the semiconductor devices can be variously used as light emitting elements, light receiving elements, various diodes, and the like.

Particularly, light emitting elements such as light emitting diodes or laser diodes using Group III-V or Group II-VI compound semiconductor materials have advantages in that, since a thin film growing technology and an element material have been developed, various colors such as a red color, a green color, a blue color, and an ultraviolet color can be expressed, high efficiency white light can be generated using a fluorescent material or by mixing colors, and low power consumption, a semi-permanent lifetime, a fast response time, safety, and environmental friendliness can be achieved in comparison with a conventional light source such as a fluorescent lamp and an incandescent lamp.

Furthermore, in a case in which light receiving elements, such as photodetectors or solar cells, are manufactured using Group III-V or Group II-VI compound semiconductors, since element materials are developed to generate a photocurrent by absorbing light in various wavelength ranges, light in various wavelength ranges from a gamma ray range to a radio wavelength range can be used. In addition, since the light receiving elements have advantages of having a fast response time, safety, environmental friendliness, and easy adjustment in element materials, the light receiving elements can be also easily used for power control or ultrahigh frequency circuits or communication modules.

Accordingly, applications of the semiconductor device have extended to transmission modules of optical communication apparatuses, light emitting diode backlights which replace a cold cathode fluorescence lamps (CCFLs) included in backlights of liquid crystal display (LCD) devices, lighting apparatuses including a white light emitting diode which can replace fluorescent or incandescent bulbs, car headlights, traffic lights, sensors to detect gas or fire, and the like. In addition, applications of the semiconductor device can be extended to circuits for a high-frequency application, other power control devices, and communication modules.

Particularly, light emitting elements configured to emit light in an ultraviolet wavelength range can perform curing or sterilizing, and thus can be used for curing, medical treatment, and sterilization.

Recently, research on an ultraviolet light emitting element has been actively performed, but there is a problem in making the ultraviolet light emitting element into a flip chip.

BRIEF DESCRIPTION OF THE DRAWINGS

The embodiments will be described in detail with reference to the following drawings in which like reference numerals refer to like elements wherein.

DETAILED DESCRIPTION

The embodiments of the present invention may be modified into different forms or the plurality of embodiments may be combined, and the scope of the present invention is not limited to the embodiments which will be described below.

Although a description given in a specific embodiment is not given in other embodiments, the description may be understood to be descriptions of the other embodiments as long as there are no opposite to or inconsistent descriptions given.

For example, when a feature of an element A is described in a specific embodiment and a feature of an element B is described in another embodiment, the scope of the present invention includes an embodiment in which the elements A and B are combined even when the embodiment is not clearly described as long as there are no opposite to or inconsistent descriptions given.

In a description of the embodiment, in a case in which any one element is described as being formed on (or under) another element, such a description includes both a case in which the two elements are formed to be in direct contact with each other and a case in which the two elements are in indirect contact with each other such that one or more other elements are interposed between the two elements. In addition, when in a case in which one element is described as being formed on (or under) the other element, such a description may include a case in which one element is formed at an upper side or a lower side with respect to the other element.

Hereinafter, the embodiments of the present invention will be described in detail with reference to the accompanying drawings so that those skilled in the art may easily perform the present invention.

Figure 1:
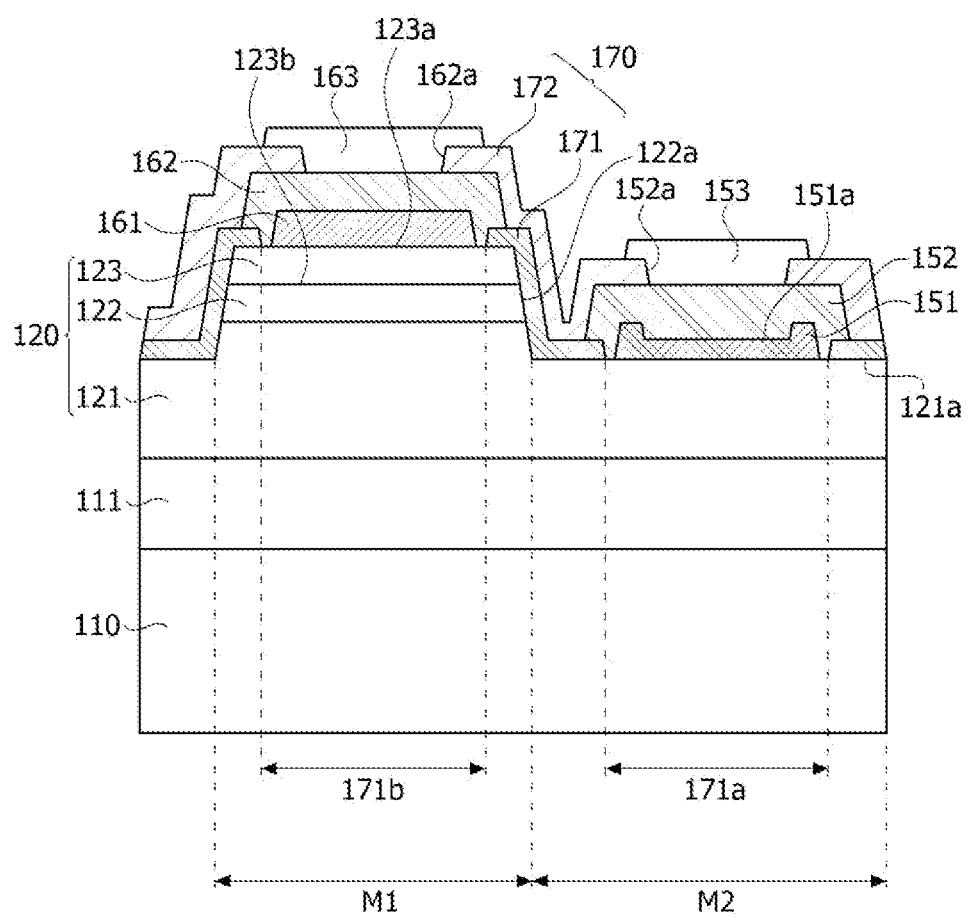
FIG. 1 is a cross-sectional view illustrating a semiconductor device according to one embodiment of the present invention.
Figure 2:
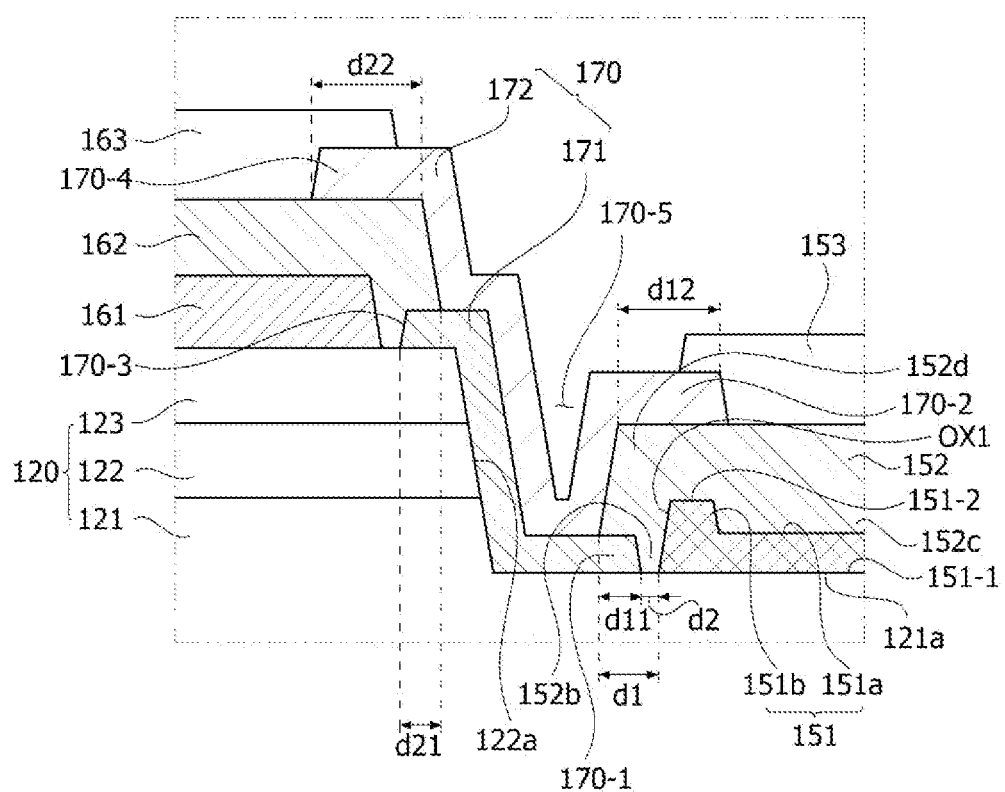
FIG. 2 is an enlarged view illustrating a part of FIG. 1.
Figure 3:
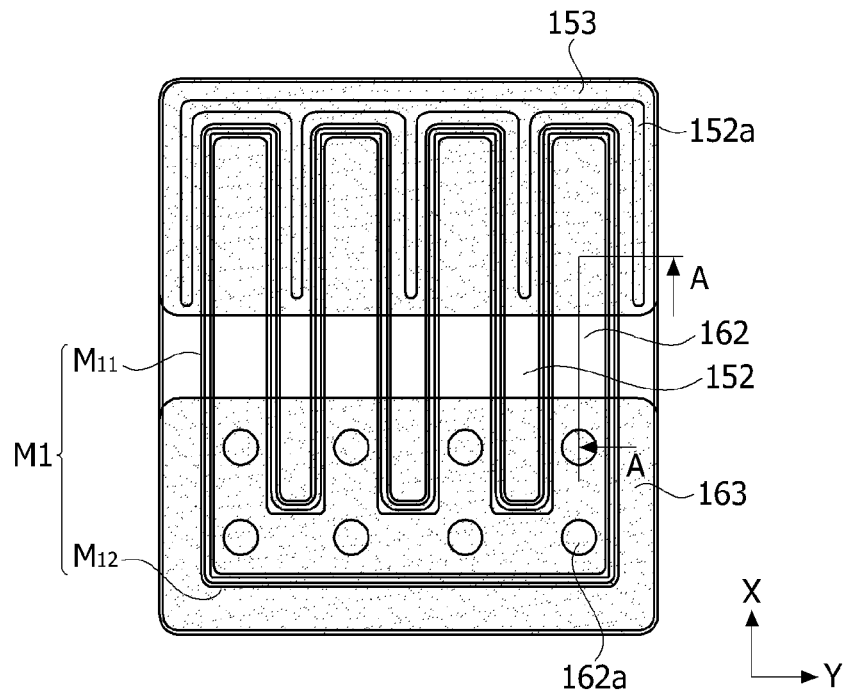
FIG. 3 is a plan view illustrating the semiconductor device according to one embodiment of the present invention.
Figure 4:
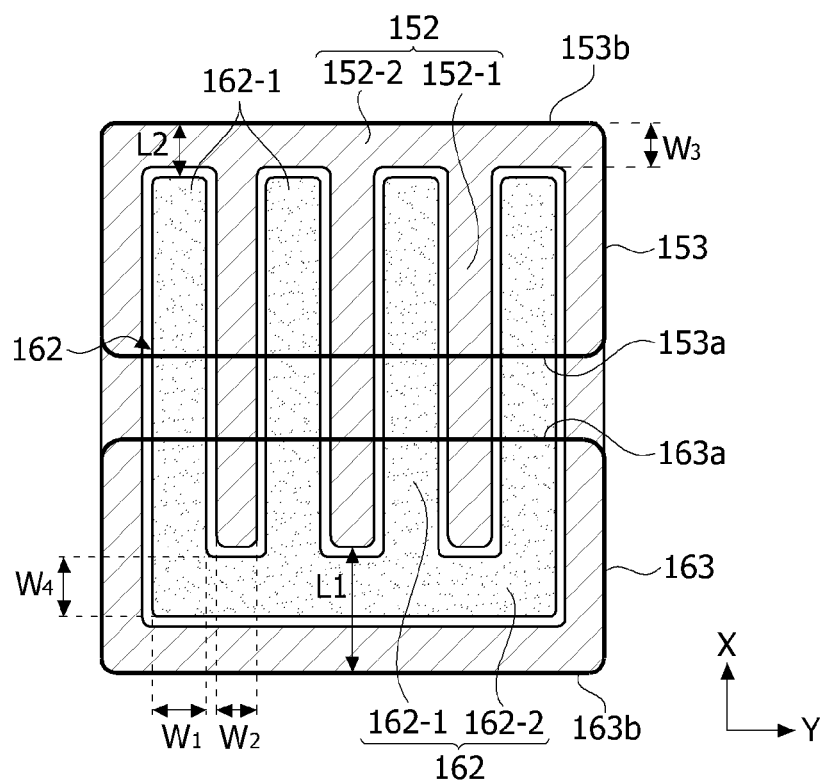
FIG. 4 is a view illustrating an arrangement of a first electrode and a second electrode according to one embodiment.

FIG. 1 is a cross-sectional view illustrating a semiconductor device according to one embodiment of the present invention, FIG. 2 is an enlarged view illustrating a part of FIG. 1, FIG. 3 is a plan view illustrating the semiconductor device according to one embodiment of the present invention, and FIG. 4 is a view illustrating an arrangement of a first electrode and a second electrode according to one embodiment.

Referring to FIG. 1, the semiconductor device according to one embodiment of the present invention may include a semiconductor structure (a light emitting structure) 120, a first insulation layer 171 disposed on the semiconductor structure 120, a first electrode 151 disposed on a first conductive semiconductor layer 121, a second electrode 161 disposed on a second conductive semiconductor layer 123, a first cover electrode 152 disposed on the first electrode 151, a second cover electrode 162 disposed on the second electrode 161, and a second insulation layer 172 disposed on the first cover electrode 152 and the second cover electrode 162.

The semiconductor structure 120 according to the embodiment of the present invention may output light in an ultraviolet wavelength band. For example, the semiconductor structure 120 may output light in a near ultraviolet wavelength band (UV-A), light in a far ultraviolet wavelength band (UV-B), or light in a deep ultraviolet wavelength band (UV-C). The wavelength range may be determined by a composition ratio of Al in the semiconductor structure 120.

For example, the UV-A may have a peak wavelength in the range of 320 nm to 390 nm, the UV-B may have a peak wavelength in the range of 280 nm to 320 nm, and the UV-C may have a peak wavelength of in the range of 100 nm to 280 nm.

When the semiconductor structure 120 emits light in an ultraviolet wavelength band, the semiconductor layers of the semiconductor structure 120 may include an $In_{x1}Al_{y1}Ga_{1-x1-y1}N$ material ($0 \leq x1 \leq 1$, $0 < y1 \leq 1$, $0 \leq x1+y1 \leq 1$) including aluminum. Here, a composition of Al may be expressed as a ratio of an atomic weight of Al to a total atomic weight of an atomic weight of In, an atomic weight of Ga, and the atomic weight of Al. For example, when the composition of Al is 40%, a composition of Ga may be 60% in $Al_{40}Ga_{60}N$.

In addition, when the embodiment is described, the meaning of "a composition is low or high," may be understood as including "a difference in a composition % (and/or a % point)" of a semiconductor layer. For example, in a case in which a composition of Al of a first semiconductor layer is 30% and a composition of Al of a second semiconductor layer is 60%, the composition of Al in the second semiconductor layer may be expressed as being higher than that of the first semiconductor layer by 30%.

The substrate 110 may be formed of a material selected from sapphire ($Al_2O_3$), SiC, GaAs, GaN, ZnO, Si, GaP, InP, and Ge, but is not limited thereto. The substrate 110 may be a transparent substrate through which light in an ultraviolet wavelength band may be transmitted.

A buffer layer 111 may reduce lattice mismatch between the substrate 110 and the semiconductor layer. The buffer layer 111 may be formed of a material in which Group III and V elements are combined, or may include any one of GaN, InN, AlN, InGaN, AlGaN, InAlGaN, and AlInN. In the present embodiment, the buffer layer 111 may be AlN, but is not limited thereto. The buffer layer 111 may include a dopant, but is not limited thereto.

The first conductive semiconductor layer 121 may be formed of a Group III-V or II-VI compound semiconductor and the like, and may be doped with a first dopant. The first conductive semiconductor layer 121 may be selected from semiconductor materials having a composition equation of $In_{x1}Al_{y1}Ga_{1-x1-y1}N$ ($0 \leq x1 \leq 1$, $0 < y1 \leq 1$, $0 \leq x1+y1 \leq 1$), for example, AlGaN, AlN, InAlGaN, and the like. In addition, the first dopant may be an n-type dopant such as Si, Ge, Sn, Se, and Te. In a case in which the first dopant is the n-type dopant, the first conductive semiconductor layer 121 doped with the first dopant may be an n-type semiconductor layer.

An active layer 122 may be disposed between the first conductive semiconductor layer 121 and the second conductive semiconductor layer 123. The active layer 122 is a layer in which electrons (or holes) injected through the first conductive semiconductor layer 121 meet holes (or electrons) injected through the second conductive semiconductor layer 123. The active layer 122 may transition to a low energy level as the electrons and holes are recombined, and may generate light having an ultraviolet wavelength.

The active layer 122 may have any one structure among a single well structure, a multi well structure, a single quantum well structure, a multi quantum well (MQW) structure, a quantum dot structure, or a quantum wire structure, but is not limited thereto.

The active layer 122 may include a plurality of well layers (not shown) and barrier layers (not shown). The well layers and the barrier layers may have a composition equation of $In_{x2}Al_{y2}Ga_{1-x2-y2}N$ ($0 \leq x2 \leq 1$, $0 < y2 \leq 1$, $0 \leq x2+y2 \leq 1$). A composition of Al of the well layers may vary according to a wavelength of light to be emitted.

The second conductive semiconductor layer 123 may be formed on the active layer 122, and may be formed of a Group III-V or II-VI compound semiconductor or the like, and the second conductive semiconductor layer 123 may be doped with a second dopant.

The second conductive semiconductor layer 123 may be formed of a semiconductor material having a composition equation of an $In_{x5}Al_{y2}Ga_{1-x5-y2}N$ ($0 \leq x5 \leq 1$, $0 < y2 \leq 1$, $0 \leq x5+y2 \leq 1$) or a material selected from AlInN, AlGaAs, GaP, GaAs, GaAsP, and AlGaInP.

In a case in which the second dopant is a p-type dopant such as Mg, Zn, Ca, Sr, and Ba, the second conductive semiconductor layer 123 doped with the second dopant may be a p-type semiconductor layer.

The semiconductor structure 120 comprises a first region M1 in which the active layer 122 and the second conductive semiconductor layer 123 are disposed on the first conductive semiconductor layer 121, and a second region M2 in which the first conductive semiconductor layer 121 is exposed. The first region M1 may be a light emitting portion and the second region M2 may be a non-light emitting portion.

The first insulation layer 171 may be interposed between the first electrode 151 and the second electrode 161. Specifically, the first insulation layer 171 may include a first hole 171a in which the first electrode 151 is disposed and a second hole 171b in which the second electrode 161 is disposed.

The first electrode 151 may be disposed on a first surface 121a of the first conductive semiconductor layer 121, and the second electrode 161 may be disposed on a first surface 123a of the second conductive semiconductor layer 123.

The active layer 123 is provided between the first surface 121a of the first conductive semiconductor layer 121 and a second surface 123b of the second conductive semiconductor layer 123 that is opposite to the first surface 123a of the second conductive semiconductor layer 123.

The first electrode 151 and the second electrode 161 may be formed of at least one among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, and Hf, but are not limited thereto. For example, the first electrode 151 may include a plurality of metal layers (for example, a Cr/Al/Ni), and the second electrode 161 may be ITO.

Referring to FIG. 2, the first electrode 151 may include a first surface 151-1 facing the first surface 121a of first conductive semiconductor layer 121 and a second surface 151-2 that is opposite to the first surface 121a of first conductive semiconductor layer 121. The first electrode 151 may include a first groove 151a disposed on the second surface 151-2 thereof.

Unlike a general visible light emitting element, in the case of an ultraviolet light emitting element, it is necessary to heat-treat an electrode at a high temperature for ohmic contact. For example, the first electrode 151 and/or the second electrode 161 may be heat-treated at a temperature of about 600 to 900° C., and in this process, an oxide layer (OX1) may be formed on the second surface 151-2 of the first electrode 151. However, since the oxide layer may sever as a resistive layer, an operating voltage may increase.

Accordingly, the oxide layer OX1 of the first electrode 151 according to the embodiment may be removed by forming the first groove 151a in the one surface thereof. In this process, a protrusion 151b which surrounds the first groove 151a may be formed.

The protrusions 151b extend from the second surface 151-2 of the first electrode 151 in a direction away from the first surface 121a of first conductive semiconductor layer 121. Thus, the second surface 151-2 on which the first groove 151a is disposed is lower than the second surface 151-2 on which the protrusions 151b are disposed. The protrusions 151b may be arranged to surround the first grooves 151a but are not limited thereto. The protrusions 151b may include a ring shape surrounding the first grooves 151a.

In a case in which the entire first electrode 151 is etched, the first insulation layer 171 around the first electrode 151 may be etched and a short-circuit therebetween may occur. Accordingly, in the embodiment, etching of the first insulation layer 171 may be prevented by etching only a part of the first electrode 151. Accordingly, an edge region of the first electrode 151 according to the embodiment remains to form the protrusion 151b.

As necessary, the protrusion 151b of the first electrode 151 may also be relatively slightly etched by adjusting a thickness of a mask. In this case, a part of the oxide layer remaining on the protrusion 151b and a side surface of the first electrode 151 may also be removed.

The first cover electrode 152 may be formed on the first electrode 151. The first electrode may include a first uneven portion 152c disposed inside the first groove. The first cover electrode 152 may cover the side surface of the first electrode 151. In this case, since a contact area of the first cover electrode 152 and the first electrode 151 increases, the operating voltage may further decrease.

The first insulation layer 171 is provided on the first surface 121a of the first semiconductor layer 121, the first surface 123a of the second semiconductor layer 123, and a side surface 122a of the active layer 122.

The first cover electrode 152 may include a second uneven portion 152b disposed on a space region d2 between the first insulation layer 171 and the lateral edge of the first electrode 151. The second uneven portion 152b may be in direct contact with the first conductive semiconductor layer 121. Accordingly, current injection efficiency may increase. A width of the space region d2 may be in a range of about 1 μm to 10 μm, but is not limited thereto. The first cover electrode 152 extends into the first groove 151a of the first electrode 151 and extends into the space region d2 between the first insulation layer 171 and the lateral edge of the first electrode 151.

The first cover electrode 152 may extend to a portion above the first insulation layer 171. The first cover electrode 152 overlaps with the first insulation layer 171 in a thickness direction of the first conductive semiconductor. Accordingly, since the total area of the first cover electrode 152 increases, the operating voltage may decrease.

Referring back to FIG. 1, the second cover electrode 162 may be disposed on the second electrode 161. The second cover electrode 162 may cover to a side surface of the second electrode 161, but is not limited thereto. For example, the second cover electrode 162 may also be disposed only on the second electrode 161.

The first cover electrode 152 and the second cover electrode 162 may be formed of at least one among Ni/Al/Au, Ni/IrOx/Au, Ag, Ni, Cr, Ti, Al, Rh, Pd, Ir, Sn, In, Ru, Mg, Zn, Pt, Au, and Hf, but are not specifically limited thereto. However, outermost layers of the first cover electrode 152 and the second cover electrode 162 which are exposed to the outside may include gold (Au). Gold (Au) may prevent corrosion of the electrodes, improve an electrical conductivity, and thus allow the first cover electrode 152 and the second cover electrode 162 to be easily electrically connected to pads.

The second insulation layer 172 may disposed on the first cover electrode 152, the second cover electrode 162, and the first insulation layer 171. The second insulation layer 172 may include a first opening through which the first cover electrode 152 is exposed and a second opening through which the second cover electrode 162 is exposed. The first opening includes a first via hole 152a and the second opening includes second via holes 162a.

The first insulation layer 171 and the second insulation layer 172 may be formed of at least one selected from the group consisting of $SiO_2$, a $Si_xO_y$, $Si_3N_4$, a $Si_xN_y$, a $SiO_xN_y$, $Al_2O_3$, $TiO_2$, AlN, and the like. In a process of forming the second insulation layer 172, a part of a boundary between the first insulation layer 171 and the second insulation layer 172 may be removed.

A first pad 153 may be disposed on the first cover electrode 152, and a second pad 163 may be disposed on the second cover electrode 162. The first pad 153 and the second pad 163 may be eutectic-bonded, but are not limited thereto.

According to the embodiment, since the second insulation layer 172 is disposed on the first insulation layer 171 in the region between the first electrode 151 and the second electrode 161, Thus, moisture and contaminants can be prevented from penetrating the semiconductor structure 120. The first insulation layer 171 and the second insulation layer 172 may form one insulation layer 170 during the high-temperature growth process. The insulation layer 170 may include a recess 170-5 in a region between the first electrode 151 and the second electrode 152.

The insulation layer 170 may include a first insulation portion 170-1 disposed between the first conductive semiconductor layer 121 and the first cover electrode 152, and a second insulation portion 170-2 disposed on an upper surface of the first cover electrode 152. The first cover electrode 152 may include a first protrusion portion 152d disposed between an upper surface of the first insulation portion 170-1 and a lower surface of the second insulation portion 170-2.

The first insulation portion 170-1 may extend to the inside of the first cover electrode 152. Thus, moisture and contaminants can be prevented from penetrating the semiconductor structure 120. When the first insulation portion 170-1 and the first cover electrode 152 are separated from each other, the first conductive semiconductor layer 121 may be exposed between the first insulation portion 170-1 and the first cover electrode 152 and may be oxidized.

The second insulation portion 170-2 may be disposed on a side surface and an upper surface of the first cover electrode 152 and may be extended between the first cover electrode 152 and the first pad 153. Thus, moisture and contaminants can be prevented from penetrating the semiconductor structure 120.

According to the embodiment, the first insulation layer 171, the first cover electrode 152, and the second insulation layer 172 can be configured to prevent the penetration of moisture and contaminants.

A first width d11 in which the first insulation portion 170-1 overlaps with the first cover electrode 152 in a vertical direction may be greater than a width of the first spacing region d2. Therefore, the effect of preventing moisture permeation can be increased.

A width d12 in which the second insulation portion 170-2 overlaps with the first cover electrode 152 in the vertical direction may be greater than the first width d11 in which the first insulation portion 170-1 overlaps with the first cover electrode 152. At this time, the second insulation portion 170-2 may overlap with the first electrode 151 in the vertical direction. Therefore, this can effectively prevent moisture permeation.

The insulation layer 170 includes a third insulation portion 170-3 disposed between the second conductive semiconductor layer 123 and the second cover electrode 162, and a fourth insulation portion 170-4 disposed on the upper surface of the second cover electrode 162.

The third insulation portion 170-3 may extend to the inside of the second cover electrode 162. Therefore, it is possible to prevent moisture and contaminants from penetrating the second conductivity semiconductor layer 123. When the third insulation portion 170-3 and the second cover electrode 162 are separated from each other, the second conductive semiconductor layer 123 is exposed between the third insulation portion 170-3 and the second cover electrode 162 so that the second conductive semiconductor layer 123 may be oxidized.

The fourth insulation portion 170-4 may be disposed on a side surface and an upper surface of the second cover electrode 162 and may extend between the second cover electrode 162 and the second pad 163. Thus, moisture and contaminants can be prevented from penetrating the semiconductor structure 120.

A width d22 in which the fourth insulation portion 170-4 overlaps with the second cover electrode 162 in the vertical direction may be greater than a width d21 in which the third insulation portion 170-3 overlaps with the first cover electrode 162.

The second cover electrode 162 may extend into the second spaced region between the third insulation portion 170-3 and the side surfaces of the second electrode 161 and may contact with the second conductive type semiconductor layer 123. Therefore, the current injection efficiency can be improved. A width of the second spacing region may be about 1 μm to about 10 μm, but is not limited thereto.

Referring to FIGS. 3 and 4, the semiconductor structure 120 may include a light emitting portion M1 etched to protrude therefrom. The light emitting portion M1 may include the active layer 122 and the second conductive semiconductor layer 123.

Here, a ratio P11/P12 of a maximum perimeter P11 to a maximum area P12 of the light emitting portion M1 may be in a range of 0.02 $\mu m^{-1}$ to 0.05 $\mu m^{-1}$. Here, the maximum perimeter and the maximum area of the light emitting portion M1 may be the same as those of the second conductive semiconductor layer (or active layer).

When the ratio P11/P12 is 0.02 or more, since the perimeter of the light emitting portion increases more than the area thereof, optical output power may increase. For example, since the possibility of light being emitted from a side surface thereof increases, the optical output power may increase. In addition, a problem in that the optical output power decreases because the perimeter of the light emitting portion excessively increases in comparison to the area thereof in a case in which the ratio P11/P12 is 0.05 or less may be prevented. For example, in a case in which the perimeter of the light emitting portion excessively increases in the same area thereof, very narrow light emitting portions may be disposed consecutively. However, in this case, since electrodes disposed on the light emitting portions may also be very narrow, resistance thereof may increase. Accordingly, the operating voltage may increase.

The light emitting portion M1 may include a plurality of first light emitting portions M11 in which a plurality of light emitting portions are spaced apart from each other in a second direction, and a second light emitting portion M12 extending in the second direction and connected to ends of the plurality of first light emitting portions to achieve a proper ratio of the perimeter to the area the light emitting portion M1.

The second cover electrode 162 may have a shape corresponding to the light emitting portion M1. In addition, the first electrode may be disposed in a shape which surrounds the second electrode.

The first pad 153 and the second pad 163 may be disposed on a flat surface to be spaced apart from each other in a first direction. The first direction (the first plan direction) may be an X direction, and the second direction (the second plan direction) may be a Y direction. The first direction and the second direction may be perpendicular to each other, but are not limited thereto.

The first pad 153 may be electrically connected to the first cover electrode 152 through the first via hole 152a of the second insulation layer, and the second pad 163 may be electrically connected to the second cover electrode 162 through the second via holes 162a of the second insulation layer. The first via hole 152a may be one hole formed along a shape of the first cover electrode 152, and the second via holes 162a may include a plurality of via holes. However, the number and shape of the holes are not limited thereto.

Referring to FIG. 4, the second cover electrode 162 may include a second connection electrode 162-2 which extends between the second conductive semiconductor layer 123 and the second pad 163 in the second direction (Y direction), and a plurality of second branch electrodes 162-1 which extend from the second connection electrode 162-2 toward the first pad 153 in the first direction (X direction).

The first cover electrode 152 may include a first connection electrode 152-2 which extends between the first conductive semiconductor layer 121 and the first pad 153 in the second direction, and a plurality of first branch electrodes 152-1 which extend from the first connection electrode 152-2 toward the second pad 163. The first via hole 152a includes a shape corresponding to the first connection electrode 152-2 and the first branch electrodes 152-1.

The first connection electrode 152-2 may be disposed to extend along an edge of the semiconductor structure 120 to surround the second cover electrode 162. Accordingly, when a current is applied thereto, the current may be uniformly distributed to the first conductive semiconductor layer 121.

A width W3 of the first connection electrode 152-2 in the first direction may be smaller than a width W4 of the second connection electrode 162-2 in the first direction. A ratio W3:W4 of the width of the first connection electrode 152-2 in the first direction to the width of the second connection electrode 162-2 in the first direction may be in a range of 1:1.1 to 1:1.5. In a case in which the width ratio W3:W4 is 1:1.1 or more, since an area of the second cover electrode 162 increases, hole injection efficiency may increase, and in a case in which the width ratio is 1:1.5 or less, since an area of the first connection electrode 152-2 is secured, electron injection efficiency may increase.

The first branch electrode 152-1 may be interposed between adjacent second branch electrodes 162-1. Here, a width W2 of the first branch electrode 152-1 in the second direction may be smaller than a width W1 of the second branch electrode 162-1 in the second direction. A ratio W2:W1 of the width W2 of the first branch electrode 152-1 in the second direction to the width W1 of the second branch electrode 162-1 in the second direction may be in a range of 1:2 to 1:4. In a case in which the width ratio W2:W1 is 1:2 or more, since the area of the second cover electrode 162 increases, the hole injection efficiency may increase. In addition, in a case in which the width ratio is 1:4 or less, since the area of the first cover electrode 152 may be secured, the electron injection efficiency may increase.

The area of the second cover electrode 162 may be greater than that of the first cover electrode 152. A ratio R2:R1 of a total area R1 of the second cover electrode 162 to a total area R2 of the first cover electrode 152 may be in a range of 1:0.5 to 1:0.7. In a case in which the area ratio is 1:0.5 or more, since the area of the first cover electrode 152 is secured, the electron injection efficiency may increase, and the first cover electrode 152 may be disposed to surround the second cover electrode 162. Accordingly, current distribution efficiency may also increase.

In a case in which the area ratio is 1:0.7 or less, since the area of the second cover electrode 162 is secured, the hole injection efficiency and optical output power may increase.

Ends of the first branch electrodes 152-1 may be interposed between the second pad 163 and the first conductive semiconductor layer 121, and ends of the second branch electrode 162-1 may be interposed between the first pad 153 and the second conductive semiconductor layer 123. That is, the first branch electrode 152-1 may overlap the second pad 163 in a thickness direction of the first conductive semiconductor layer 121, and the second branch electrode 162-1 may overlap the first pad 153 in the thickness direction of the first conductive semiconductor layer 121.

The first pad 153 may include a first side surface 153b and a second side surface 153a which are parallel in the second direction, and the second pad 163 may include a third side surface 163a parallel to the second direction and adjacent to the second side surface 153a and a fourth side surface 163b parallel to the third side surface 163a.

Here, a distance L1 from the end of the first branch electrode 152-1 to the fourth side surface 163b of the second pad 163 in the first direction may be greater than a distance L2 from the end of the second branch electrode 162-1 to the first side surface 153b of the first pad 153 in the first direction. An overlap area of the second branch electrode 162-1 and the first pad 153 may be greater than that of the first branch electrode 152-1 and the second pad 163.

FIGS. 5 to 12 are plan and cross-sectional views showing a manufacturing method of a semiconductor device according to one embodiment of the present invention.

Figure 5A:
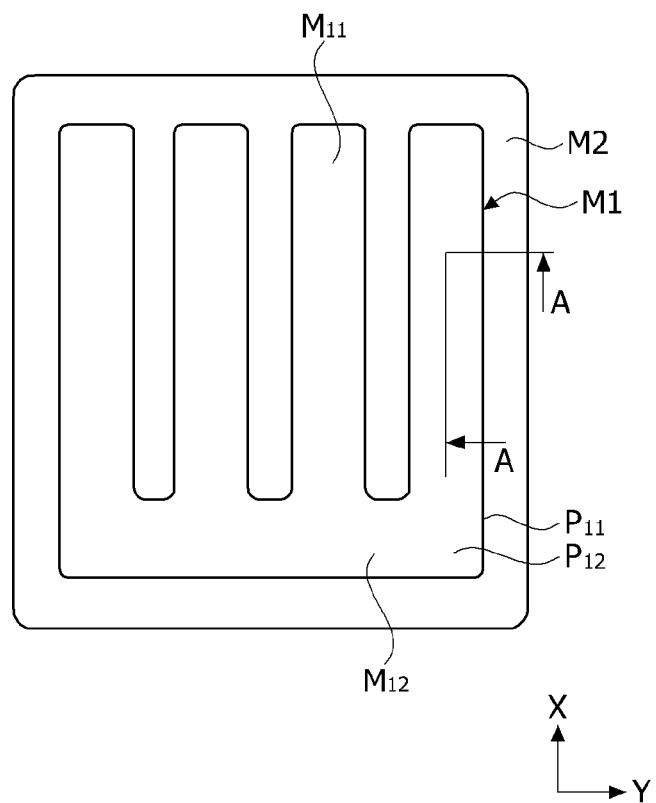
FIGS. 5A and 5B respectively are plan and cross-sectional views illustrating a light emitting region formed through a mesa etching process.
Figure 5B:
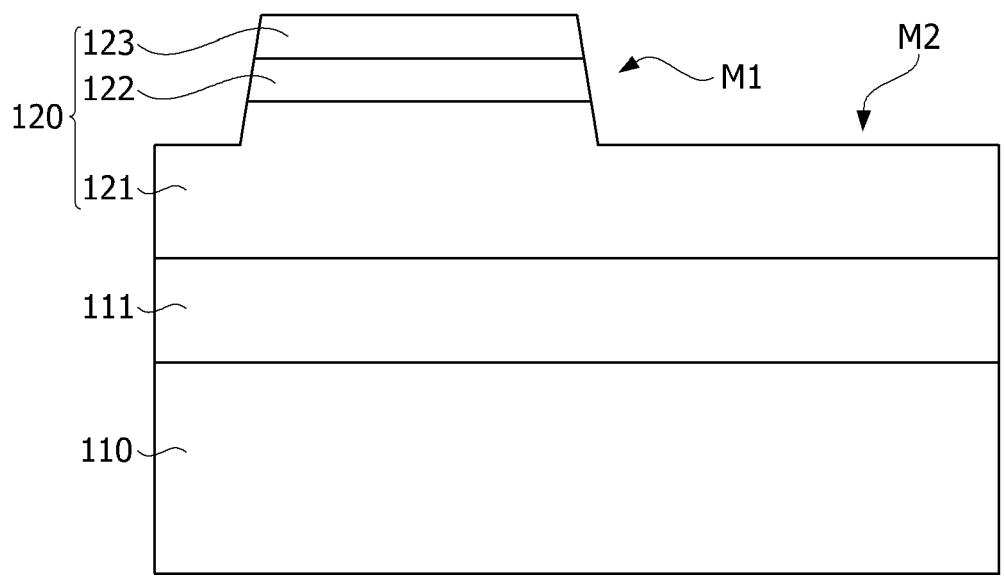

Referring to FIGS. 5A and 5B, a buffer layer 111 and a semiconductor structure 120 including a first conductive semiconductor layer 121, an active layer 122, and a second conductive semiconductor layer 123 may be disposed on a substrate 110.

According to the embodiment, the semiconductor structure 120 may include a non-light emitting portion M2 etched such that the first conductive semiconductor layer 121 is exposed, and the light emitting portion M1 which protrudes in comparison to the non-light emitting portion M2. The light emitting portion M1 may include the active layer 122 and the second conductive semiconductor layer 123.

Here, the ratio P11/P12 of the maximum perimeter P11 of the light emitting portion M1 to the maximum area P12 of the light emitting portion may be in a range of 0.02 $\mu m^{-1}$ to 0.05 $\mu m^{-1}$. In a case in which the condition is met, since the perimeter of the same area increases, the optical output power may increase.

The light emitting portion M1 may include the plurality of first light emitting portions M11 in which the plurality of light emitting portions are spaced apart from each other in the second direction (Y direction), and the second light emitting portion M12 which extends in the second direction (Y direction) and connects the ends of the plurality of first light emitting portions to achieve a proper ratio of the perimeter and the area.

Figure 6A:
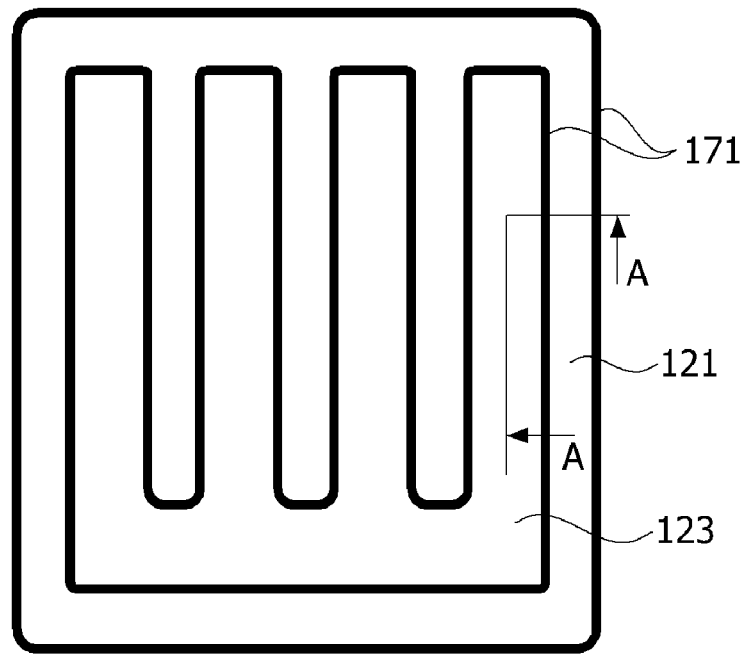
FIGS. 6A and 6B respectively are plan and cross-sectional views illustrating a first insulation layer formed on a semiconductor structure.
Figure 6B:
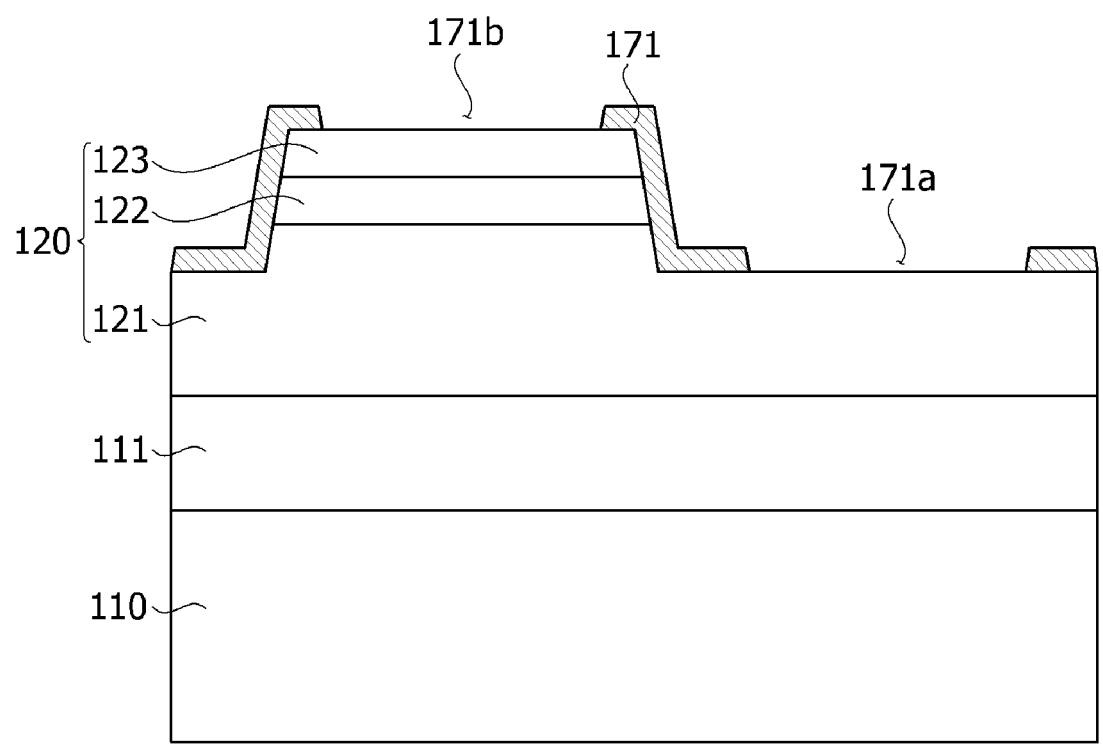

Referring to FIGS. 6A and 6B, a first insulation layer 171 may be formed on the semiconductor structure 120, and a first hole 171a and a second hole 171b may be formed. The first insulation layer 171 may be formed of at least one selected from the group consisting of $SiO_2$, $Si_xO_y$, $Si_3N_4$, $Si_xN_y$, $SiO_xN_y$, $Al_2O_3$, $TiO_2$, AlN, and the like.

Figure 7A:
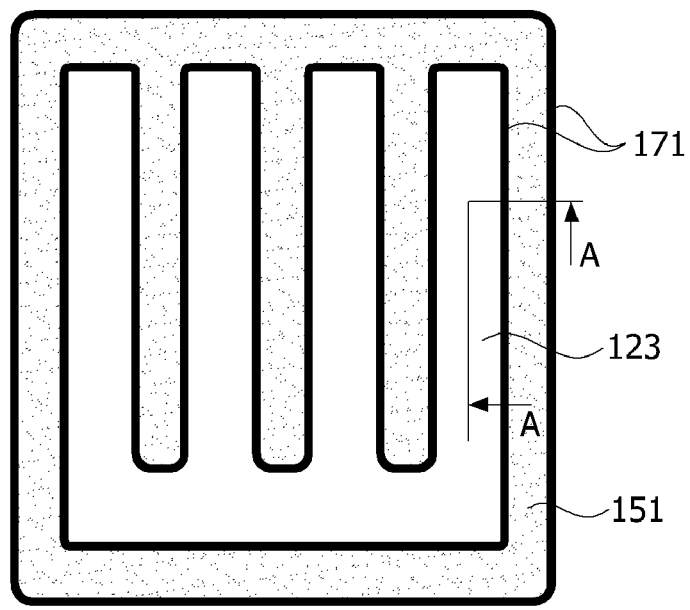
FIGS. 7A and 7B respectively are plan and cross-sectional views illustrating the first electrode.
Figure 7B:
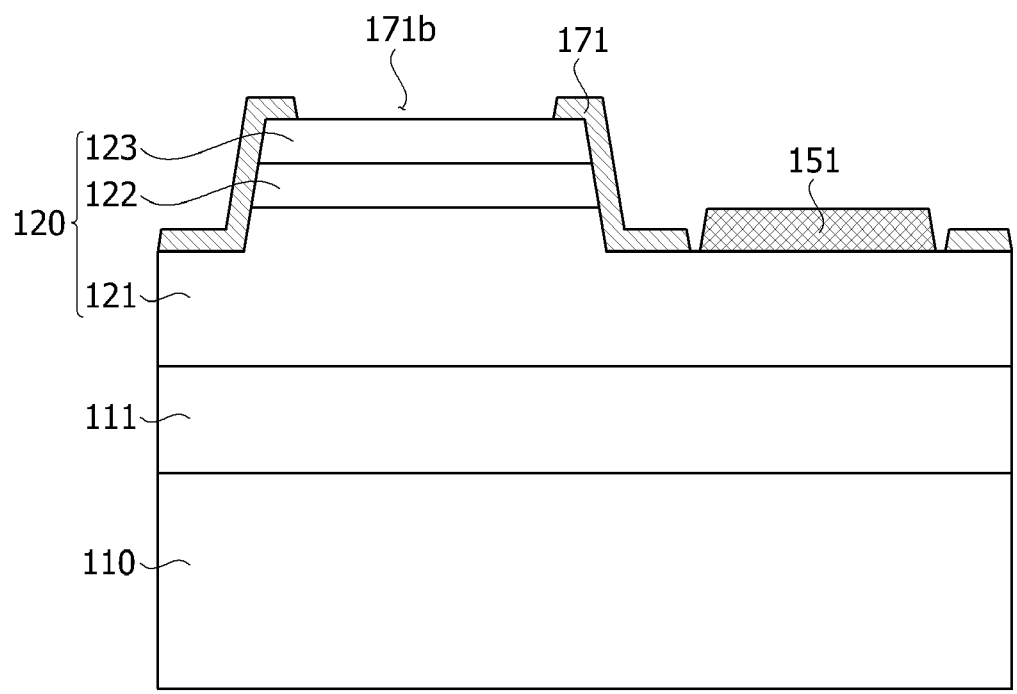
Figure 8A:
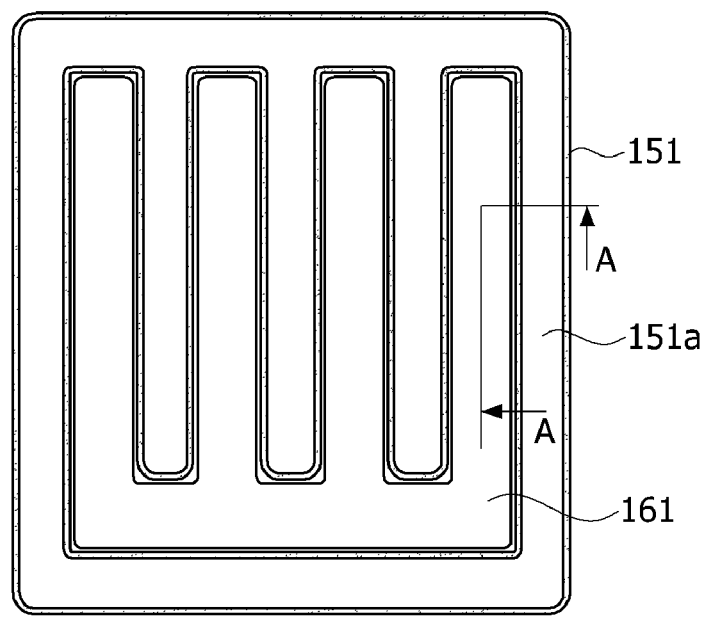
FIGS. 8A and 8B respectively are plan and cross-sectional views illustrating the second electrode.
Figure 8B:
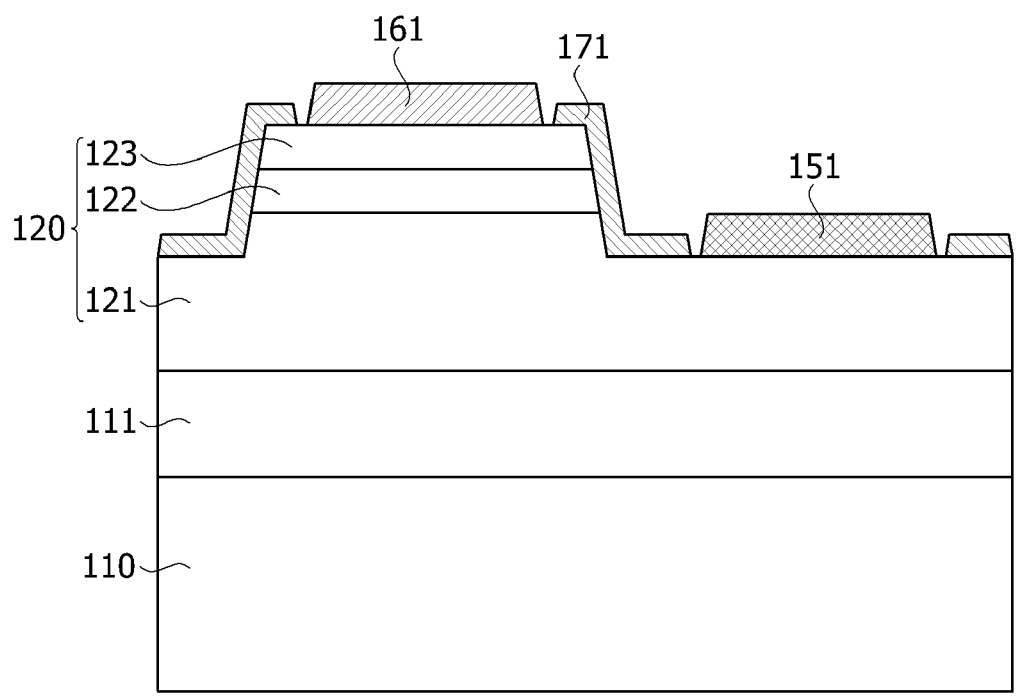

Referring to FIGS. 7A and 7B, a first electrode 151 may be formed on the exposed first conductive semiconductor layer 121. A thickness of the first electrode 151 may be greater than that of the first insulation layer 171. Then, as illustrated in FIGS. 8A and 8B, a second electrode 161 may be formed on the second conductive semiconductor layer 123.

A method of forming the first electrode 151 and the second electrode 161 may use a method of forming a general ohmic electrode without change. The first electrode 151 may be formed of at least one among ITO, IZO, IZTO, IAZO, IGZO, IGTO, AZO, ATO, GZO, IZON, AGZO, IGZO, ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, and Hf, but is not limited thereto. For example, the first electrode 151 may include a plurality of layers (for example, Cr/Al/Ni), and the second electrode 161 may include ITO, but the first electrode 151 and the second electrode 161 are not limited thereto.

Figure 9A:
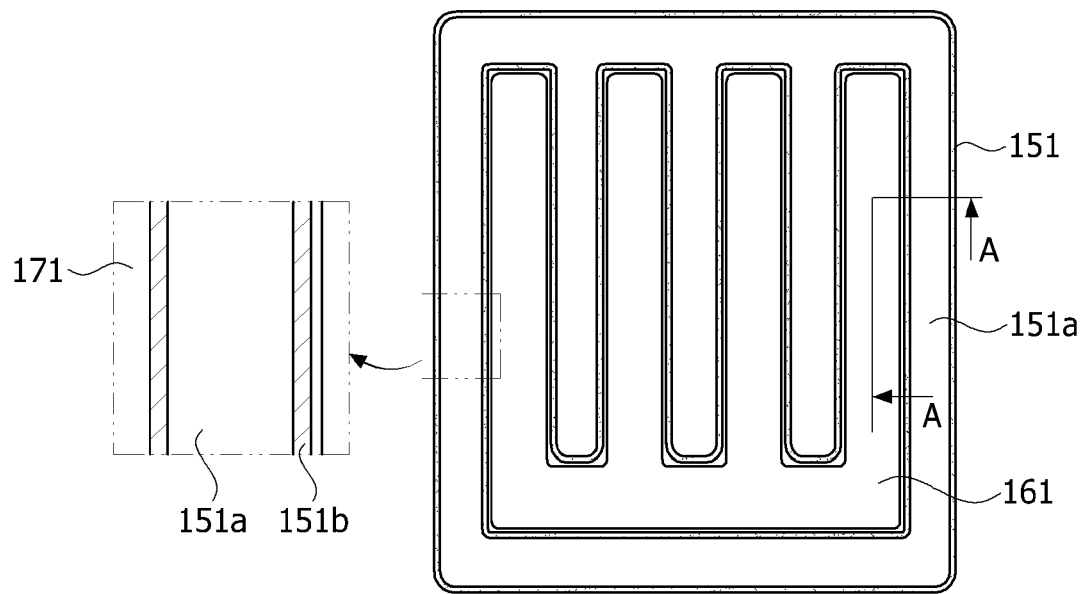
FIGS. 9A and 9B respectively are plan and cross-sectional views illustrating a first groove formed by etching the first electrode.
Figure 9B:
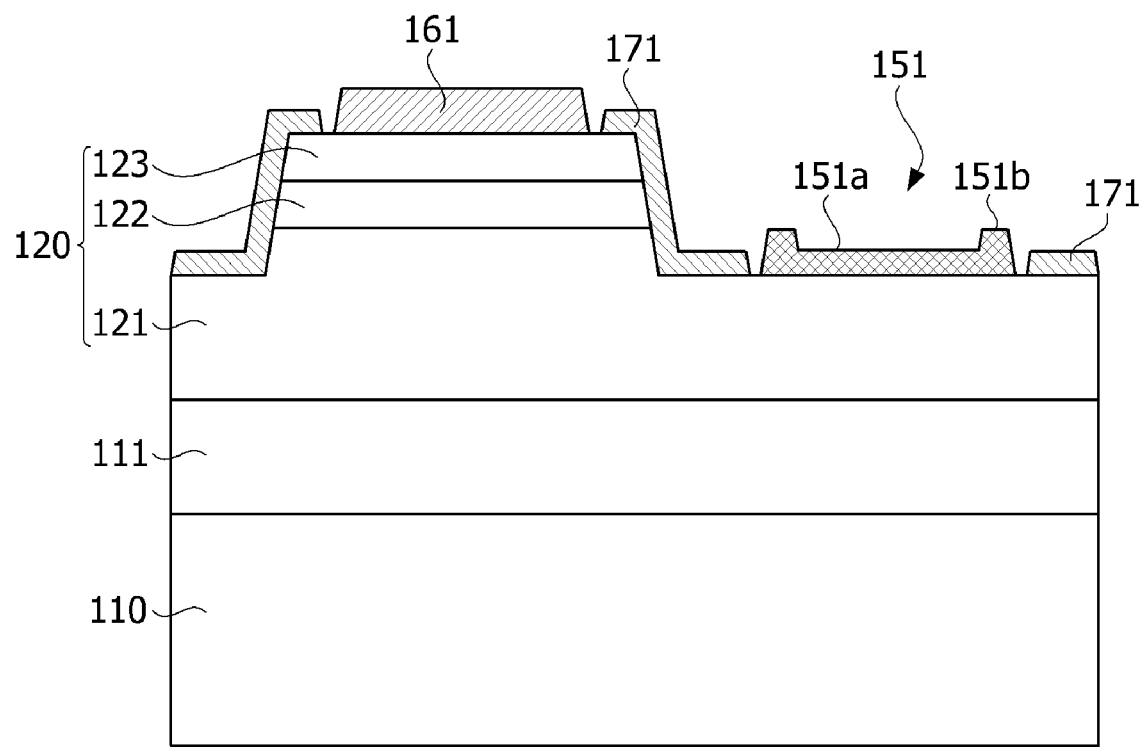

Referring to FIGS. 9A and 9B, an etching operation may be performed on the first electrode 151. A thermal process may be performed at a temperature of 800° C. for ohmic characteristics of the first electrode 151 and/or the second electrode 161. According to the embodiment, since, unlike a general visible light emitting element, a composition of Al of the first electrode 151 is increased, a temperature of the thermal process may be increased. In this process, an oxide layer may be formed on an upper surface of the first electrode 151. Accordingly, the oxide layer of the upper surface of the first electrode 151 may be etched to improve electrical connection between the first electrode 151 and a cover electrode. In this process, a first groove 151*a* and a protrusion 151*b* may be formed.

Figure 10A:
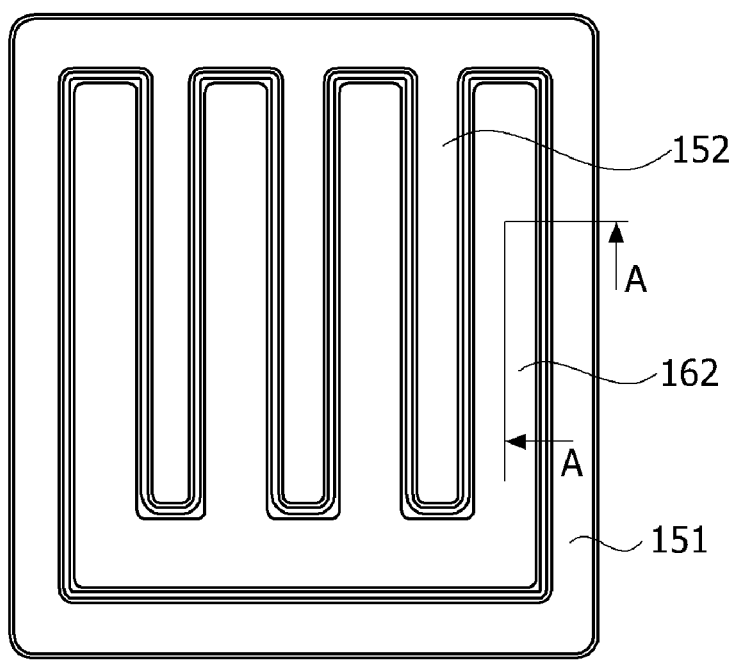
FIGS. 10A and 10B respectively are plan and cross-sectional views illustrating first and second electrodes.
Figure 10B:
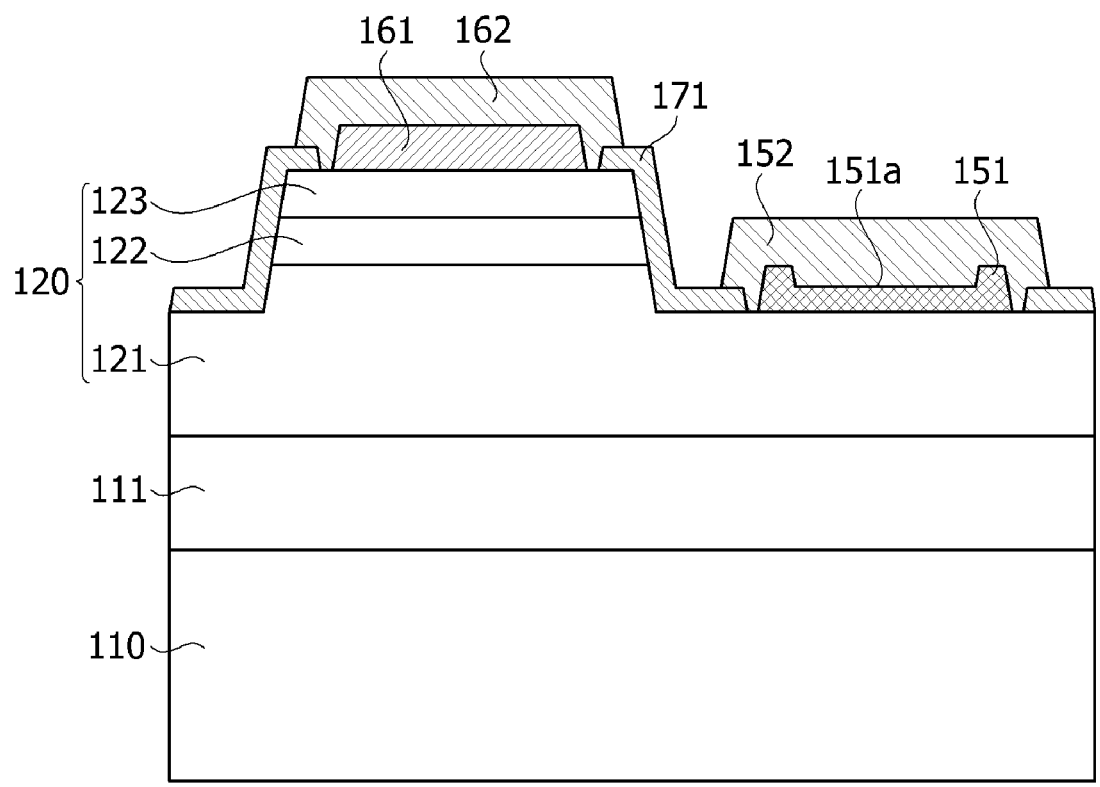

Referring to FIGS. 10A and 10B, a first cover electrode 152 may be disposed on the first electrode 151.

A second cover electrode 162 may be disposed on the second electrode 161. The first cover electrode 152 may cover to side surfaces of the second electrode 161.

The first cover electrode 152 and the second cover electrode 162 may be formed of at least one among Ni/Al/Au, Ni/IrOx/Au, Ag, Ni, Cr, Ti, Al, Rh, Pd, Ir, Sn, In, Ru, Mg, Zn, Pt, Au, and Hf, but are not limited thereto. However, outermost layers of the first cover electrode 152 and the second cover electrode 162 which are exposed to the outside may include Au.

Figure 11A:
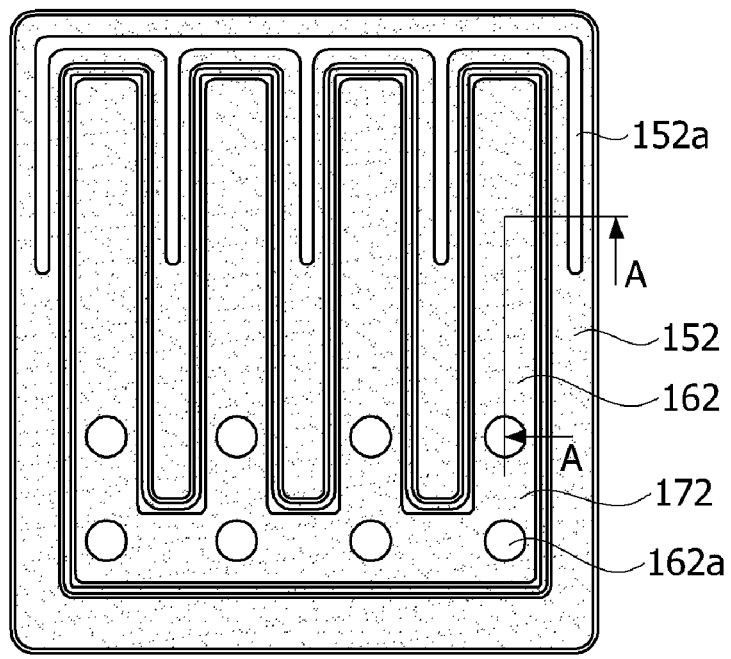
FIGS. 11A and 11B respectively are plan and cross-sectional views illustrating a second insulation layer.
Figure 11B:
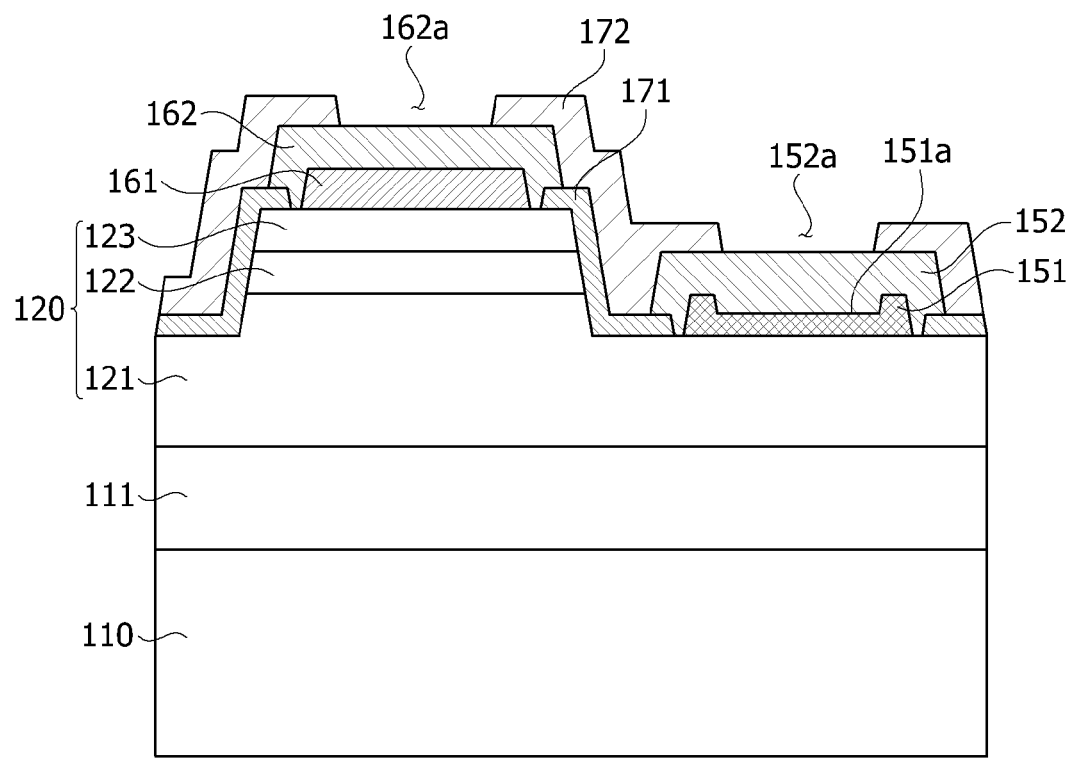

Referring to FIGS. 11A and 11B, a second insulation layer 172 may be disposed on the first cover electrode 152, the second cover electrode 162, and the first insulation layer 171. The second insulation layer 172 may include a first via hole 152*a* through which the first cover electrode 152 is exposed and a second via holes 162*a* through which the second cover electrode 162 is exposed.

Figure 12A:
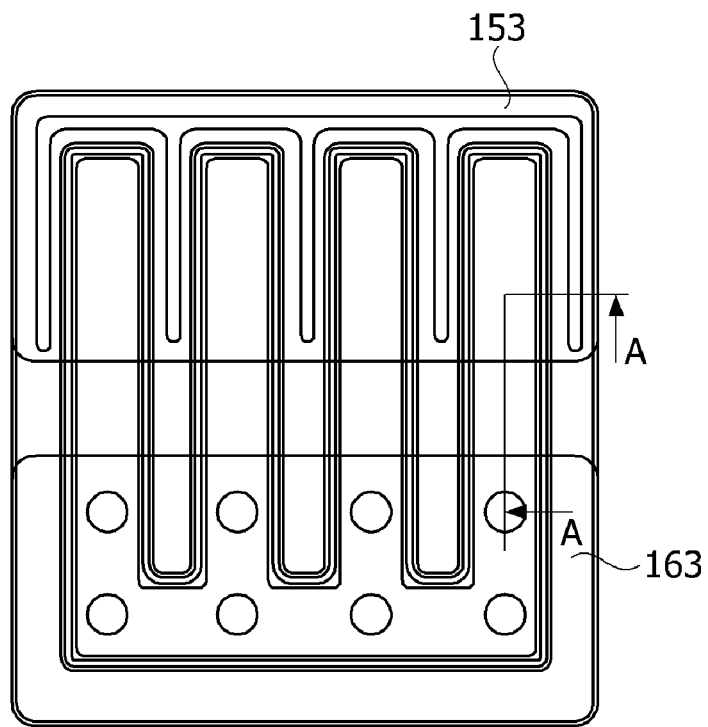
FIGS. 12A and 12B respectively are plan and cross-sectional views illustrating a pad electrode formed on the second insulation layer.
Figure 12B:
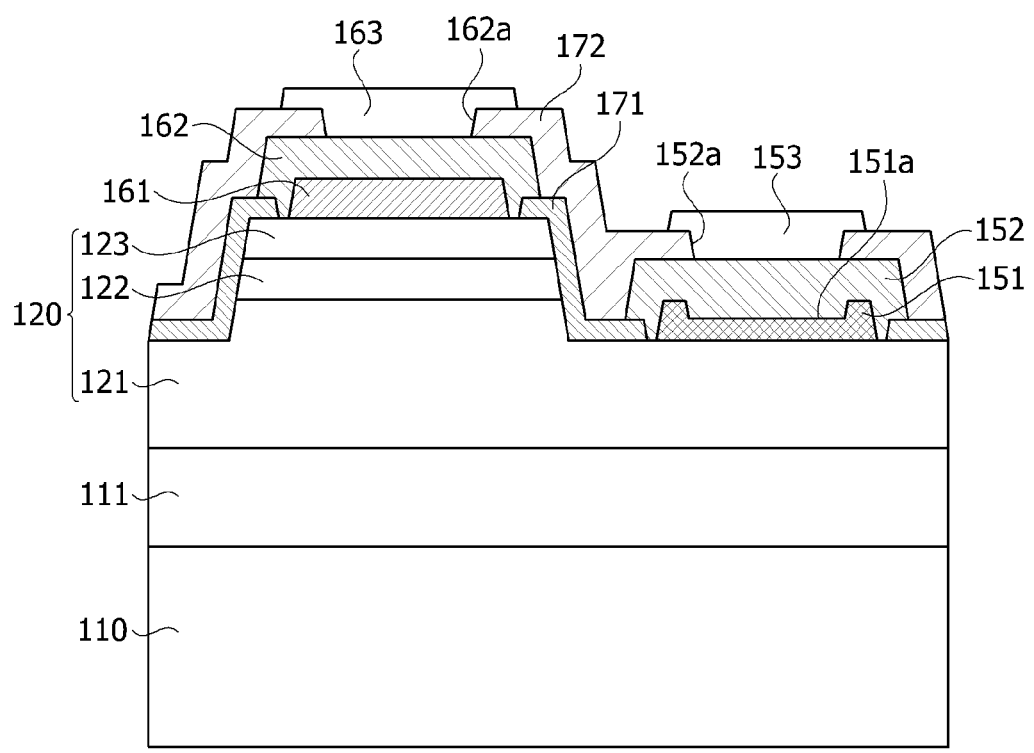

Referring to FIGS. 12A and 12B, a first pad 153 may be electrically connected to the first cover electrode 152 through the first via hole 152*a*. In addition, a second pad 163 may be electrically connected to the second cover electrode 162 through the second via holes 162*a*.

The semiconductor device may be applied to various light sources. For example, the light source may include a sterilizer, a curing device, a lighting device, a display device, and a vehicle lamp. That is, the semiconductor device may be disposed in a case and may be applied to various electronic devices configured to emit light.

A sterilizer may include the semiconductor device according to the embodiment to sterilize a desired area. The sterilizer may be applied to a home appliance such as a water purifier, an air conditioner, and a refrigerator, but is not necessarily limited thereto. That is, the sterilizer may be applied to various products requiring sterilization (for example, a medical device).

For example, a water purifier may include the sterilizer according to the embodiment to sterilize circulating water. The sterilizer may be disposed at a nozzle or outlet through which water circulates and emit ultraviolet light. Here, the sterilizer may include a waterproof structure.

A curing device may include the semiconductor device according to the embodiment and cure various kinds of liquid. The liquid includes the broadest concept which encompasses various materials cured when ultraviolet light is emitted thereto. For example, the curing device may cure various kinds of resin. Otherwise, the curing devices may also be applied to cure a beauty product such as a manicure.

A light device may include a light source module including a substrate and the semiconductor device of the embodiment, a heat sink configured to dissipate heat of the light module, and a power source configured to process or convert an electric signal received from the outside and supply the electric signal to the power source module. In addition, the lighting device may include a lamp, a head lamp, a streetlight, and the like.

A display device may include a bottom cover, a reflector, a light emitting module, a light guide plate, an optical sheet, a display panel, an image signal output circuit, and a color filter. The bottom cover, the reflector, the light emitting module, the light guide plate, and the optical sheet may be included in a backlight unit.

The reflector may be disposed on the bottom cover, and the light emitting module may emit light. The light guide plate may be disposed in front of the reflector to guide the light forward, and the optical sheet may be formed with a prism sheet and may be disposed in front of the light guide plate. The display panel may be disposed in front of the optical sheet, the image signal output circuit may supply an image signal to the display panel, and the color filter may be disposed in front of the display panel.

When the semiconductor device is used as the backlight unit of the display device, the semiconductor device may be used as an edge type backlight unit or a direct type backlight unit.

The semiconductor device may also be a laser diode other than the above-described light emitting diode.

A laser diode may include a first conductive semiconductor layer, an active layer, and a second conductive semiconductor layer, which have the above-described structure, like the light emitting element. In addition, the laser diode utilizes an electro-luminescence phenomenon in which light is emitted when a p-type first conductive semiconductor and an n-type second conductive semiconductor are bonded and a current is supplied thereto, but there are differences in directivity and a phase of the emitted light between the light emitting element and the laser diode. That is, in the laser diode, light having one specific wavelength (monochromatic beam) may be emitted with the same phase and in the same direction using a phenomenon called stimulated emission and a constructive interference phenomenon, and because of such characteristics, the laser diode may be used for an optical communication apparatus, a medical apparatus, a semiconductor processing apparatus, and the like.

An example of a light receiving element may be a photo detector, which is a kind of transducer configured to detect light and convert an intensity of the light into an electric signal. The light receiving element may be a photocell (silicon, selenium), a optical-output element (cadmium sulfide, or cadmium selenide), a photodiode (for example, a photodiode having a peak wavelength in a visible blind spectral region or a true blind spectral region), a phototransistor, a photomultiplier, a photoelectric tube (vacuum, gas-filled and sealed), an infra-red (IR) detector, and the like, but the embodiment is not limited thereto.

In addition, a semiconductor device such as a photo detector may be generally manufactured using a direct band-gap semiconductor having superior optical conversion efficiency. Alternatively, the photo detector may have various structures and may generally include a pin-type photodetector using a p-n junction, a Schottky-type photodetector using a Schottky junction, and a metal-semiconductor-metal (MSM)-type photodetector.

The photodiode may include a first conductive semiconductor layer, an active layer, and a second conductive semiconductor layer, which have the above-described structure, like the light emitting element, and is formed with a p-n junction or pin structure. The photodiode is operated by applying a reverse bias or zero bias thereto, and when light is emitted toward the photodiode, electrons and holes are generated therein and a current flows. Here, an amount of current may be proportional to an intensity of the light emitted toward the photodiode.

A photovoltaic cell or solar cell is a type of photodiode and may convert light into a current. The solar cell may include a first conductive semiconductor layer, an active layer, and a second conductive semiconductor layer, which have the above-described structure, like the light emitting element.

In addition, the photodiode may be used as a rectifier of an electronic circuit utilizing a rectifying characteristic of a general diode using a p-n junction, and may also be applied to an ultrahigh frequency circuit such as an oscillation circuit.

In addition, the above-described semiconductor device may not necessarily be formed of a semiconductor material, and may also further include a metal material in some cases. For example, a semiconductor device, such as a light receiving element, may be formed of at least one among Ag, Al, Au, In, Ga, N, Zn, Se, P, or As, and may be formed of a semiconductor material doped with a p-type or n-type dopant or an intrinsic semiconductor material.

According to the embodiments, an ultraviolet light emitting element having a flip chip type can be manufactured.

In addition, an operating voltage of an ultraviolet light emitting element can be lowered.

Useful advantages and effects of the present invention are not limited to the above-described contents, and may be more easily understood through the process of describing the above detailed embodiments of the present invention.

While embodiments of the present invention have been described above, the description is only one example, and the present invention is not limit thereto and it should be understood that various modification and applications, which are not illustrated above, may be made within the scope of the present embodiment by those skilled in the art. For example, components specifically shown in the embodiments may be modified. In addition, differences related to the modifications and applications are to be construed as being included within the scope of the present invention as defined by the appended claims.

The present invention is directed to a flip chip type ultraviolet light emitting element.

In addition, the present invention is directed to a semiconductor device in which an operating voltage thereof is improved.

In addition, the present invention is directed to a semiconductor device in which optical output power thereof increases.

Objects of the present invention are not limited to the above-described objects, and may include purposes or effects which may be derived from solutions or embodiments of objects which will be described below.

According to an aspect of the present invention, there is provided a semiconductor device including: a first conductive semiconductor layer; a second conductive semiconductor layer; an active layer disposed on the first conductive semiconductor layer and a second semiconductor layer; a first electrode electrically connected to the first conductive semiconductor layer; a second electrode electrically connected to the second conductive semiconductor layer; a first pad electrically connected to the first electrode; and a second pad electrically connected to the second electrode, wherein: the first pad and the second pad are disposed to be separated from each other in a first direction; the first electrode includes a first connection electrode configured to extend between the first conductive semiconductor layer and the first pad in a second direction perpendicular to the first direction, and a plurality of first branch electrodes configured to extend from the first connection electrode toward the second pad; the second electrode includes a second connection electrode configured to extend between the second conductive semiconductor layer and the second pad in the second direction, and a plurality of second branch electrodes configured to extend from the second connection electrode toward the first pad; a width of the first connection electrode in the first direction is smaller than a width of the second connection electrode in the first direction; and a width of the first branch electrode in the second direction is smaller than a width of the second branch electrode in the second direction.

A total area of the second electrode may be greater than that of the first electrode.

A ratio of a total area of the second electrode to a total area of the first electrode may be in a range of 1:0.5 to 1:0.7.

The first connection electrode may surround the second electrode.

A ratio (P11/P12) of a maximum perimeter (P11) of the second conductive semiconductor layer to a maximum area (P12) of the second conductive semiconductor layer may be in a range of 0.02 $\mu m^{-1}$ to 0.05 $\mu m^{-1}$.

A ratio of the width of the first connection electrode in the first direction to the width of the second connection electrode in the first direction may be in a range of 1:1.1 to 1:1.5.

A ratio of the width of the first branch electrode in the second direction to the width of the second branch electrode in the second direction may be in a range of 1:2 to 1:4.

According to another aspect of the present invention, there is provided a semiconductor device including: a light emitting structure including a first conductive semiconductor layer, a second conductive semiconductor layer, and an active layer; a first electrode electrically connected to the first conductive semiconductor layer; a second electrode electrically connected to the second conductive semiconductor layer; a first cover electrode disposed on the first electrode; and an insulation layer disposed between the first electrode and the second electrode, wherein the insulation layer comprises a first insulation portion disposed between the first conductive semiconductor layer and the first cover electrode, and a second insulation portion disposed on the first cover electrode, wherein the first cover electrode comprises a first protrusion portion disposed between an upper surface of the first insulation portion and a lower surface of the second insulation portion.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device comprising:
    a light emitting structure including a first conductive semiconductor layer, a second conductive semiconductor layer, and an active layer;
    a first electrode contacts the first conductive semiconductor layer;
    a second electrode contacts the second conductive semiconductor layer;
    a first cover electrode disposed on the first electrode;
    a first insulation layer disposed on the light emitting structure; and
    a second insulation layer disposed on the first insulation layer,
    wherein a portion of the first cover electrode is disposed between the first insulation layer and the second insulation layer, and
    wherein the first electrode includes a recess on the top surface thereof.

2. The semiconductor device of claim 1, wherein the first insulation layer comprises a first insulation portion disposed between the first conductive semiconductor layer and the first cover electrode, and a second insulation portion disposed on the first cover electrode, and
    wherein a first space region is disposed between the first insulation portion and the first electrode.

3. The semiconductor device of claim 2, wherein a width in which the first insulation portion overlaps with the first cover electrode in a vertical direction is larger than a width of the first space region.

4. The semiconductor device of claim 2, wherein the first cover electrode comprises a second uneven portion extending to the first space region and contacting to the first conductive semiconductor layer.

5. The semiconductor device of claim 2, wherein a width in which the second insulation portion overlaps with the first cover electrode in a vertical direction is larger than a width in which the first insulation portion overlaps with the first cover electrode in the vertical direction.

6. The semiconductor device of claim 5, wherein the second insulation portion overlaps the first electrode in the vertical direction.

7. The semiconductor device of claim 2, further comprising a second cover electrode disposed on the second electrode,
    wherein the first insulation layer comprises a third insulation portion disposed between the second conductive semiconductor layer and the second cover electrode, and the second insulation layer comprises a fourth insulation portion disposed on the second cover electrode.

8. The semiconductor device of claim 7, further comprising a second space region disposed between the third insulation portion and the second electrode,
    wherein the second cover electrode extends to the second space region and contacts to the second conductive semiconductor layer.

9. The semiconductor device of claim 7, wherein the light emitting structure comprises a first region in which the active layer and the second conductive semiconductor layer are disposed on the first conductive semiconductor layer, and a second region in which the first conductive semiconductor layer is exposed,
    wherein the insulation layer is disposed on an upper surface of the first conductive semiconductor layer, a side surface of the active layer, a side surface of second conductive semiconductor layer, and an upper surface of the second conductive semiconductor layer.

10. The semiconductor device of claim 9, wherein the first insulation layer comprises a recess disposed between the first electrode and the second electrode.

11. The semiconductor device of claim 9, wherein a ratio (P11/P12) of a maximum perimeter (P11) of the first region to a maximum area (P12) of the first region is in a range of 0.02 $\mu m^{-1}$ to 0.05 $\mu m^{-1}$.

12. The semiconductor device of claim 11, wherein the second cover electrode comprises a plurality of second branch electrodes disposed on the first region, and a second connection electrode connecting the plurality of second branch electrodes.

13. The semiconductor device of claim 1, wherein the first cover electrode comprises a first uneven portion disposed in the first groove.

14. A light emitting device comprising:
a substrate;
a light emitting structure disposed on the substrate, light emitting structure including a first conductivity type semiconductor layer, and a light emitting member disposed on the first conductivity type semiconductor layer;
a first electrode that contacts the first conductivity type semiconductor layer;
a second electrode that contacts the light emitting member,
wherein the light emitting member includes a second conductivity type semiconductor layer and an active layer,
wherein the active layer emits a light including a peak wavelength in a range 100 nm to 280 nm, and
wherein a ratio of a perimeter of a top surface of the light emitting member and an area of the top surface of the light emitting member is in a range of 0.02 $\mu m^{-1}$ to 0.05 $\mu m^{-1}$.

15. The light emitting device of claim 14,
wherein a ratio of an area of the second electrode to an area of the first electrode is in a range of 1:0.5 to 1:0.7.

16. The light emitting device of claim 15, wherein the first electrode includes a first connection electrode and a plurality of first branch electrodes,
wherein the first connection electrode extends in a first direction,
wherein the plurality of first branch electrode extends from the first connection electrode in a second direction, and
wherein the first direction is perpendicular to the second direction.

17. The light emitting device of claim 16, wherein the second electrode includes a plurality of second branch electrodes and a second connection electrode, and
wherein the plurality of second branch electrode extends from the second connection electrode in the second direction.

18. The light emitting device of claim 16, wherein a width of first branch electrode in the first direction is smaller than a width of second branch electrode in the first direction.

19. The light emitting device of claim 18, wherein a ratio of the width of first branch electrode and the width of second branch electrode is in a range of 1:2 to 1:4, and
wherein a ratio of a width of the first connection electrode in the second direction and a width of the second connection electrode is in a range of 1:1.1 to 1:1.5.

* * * * *